(12) United States Patent
Meikle et al.

(10) Patent No.: US 6,472,323 B1
(45) Date of Patent: *Oct. 29, 2002

(54) METHOD OF DEPOSITING TUNGSTEN NITRIDE USING A SOURCE GAS COMPRISING SILICON

(75) Inventors: Scott Meikle; Trung Doan, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/537,238

(22) Filed: Mar. 28, 2000

Related U.S. Application Data

(62) Division of application No. 08/977,800, filed on Nov. 25, 1997, which is a continuation of application No. 08/667,907, filed on Jun. 12, 1996, now Pat. No. 5,691,235, which is a continuation of application No. 08/348,646, filed on Nov. 30, 1994, now abandoned.

(51) Int. Cl.[7] .............................................. H01L 21/44
(52) U.S. Cl. ................................. 438/685; 427/255.392
(58) Field of Search ................... 438/648, 656, 438/672, 680, 685; 427/576, 584, 96, 99, 123, 124, 253, 255.17, 255.392

(56) References Cited

U.S. PATENT DOCUMENTS

| | | | |
|---|---|---|---|
| 4,238,872 A | 12/1980 | Akashi | 24/205.11 F |
| 4,774,201 A | 9/1988 | Woo et al. | 437/41 |
| 4,823,182 A | 4/1989 | Okumura | 357/67 |
| 4,847,111 A | 7/1989 | Chow et al. | 427/38 |
| 4,884,123 A | 11/1989 | Dixit et al. | 357/71 |
| 4,923,715 A * | 5/1990 | Matsuda et al. | 427/237 |
| 4,960,732 A | 10/1990 | Dixit et al. | 437/192 |
| 4,974,056 A | 11/1990 | Brodsky et al. | 357/71 |
| 5,124,780 A | 6/1992 | Sandhu et al. | 357/67 |
| 5,132,756 A | 7/1992 | Matsuda | 257/763 |
| 5,150,276 A | 9/1992 | Gonzalez et al. | 361/303 |
| 5,168,073 A | 12/1992 | Gonzalez et al. | 437/47 |
| 5,187,557 A | 2/1993 | Zenke | 257/310 |
| 5,192,703 A | 3/1993 | Lee et al. | 437/52 |
| 5,227,323 A | 7/1993 | Nishitsuji et al. | 437/47 |
| 5,238,872 A | 8/1993 | Thalapaneni et al. | 437/176 |
| 5,290,609 A | 3/1994 | Horiike et al. | 427/576 |
| 5,336,638 A | 8/1994 | Suzuki et al. | 437/190 |
| 5,341,015 A | 8/1994 | Prall et al. | 257/412 |
| 5,341,016 A | 8/1994 | Prall et al. | 257/412 |
| 5,487,923 A * | 1/1996 | Min et al. | 427/569 |
| 5,691,235 A * | 11/1997 | Meikle et al. | 437/190 |
| 5,861,675 A | 1/1999 | Sasaki et al. | 257/764 |
| 5,888,588 A | 3/1999 | Nagabushmnam et al. | 427/248.1 |

FOREIGN PATENT DOCUMENTS

| | | | |
|---|---|---|---|
| JP | 60-193333 | 10/1985 | |
| JP | 02-177427 | 7/1990 | |
| JP | 05129231 A * | 5/1993 | H01L/21/285 |
| JP | 05226282 A * | 9/1993 | H01L/21/285 |
| JP | 6-275776 | 9/1994 | H01L/27/04 |

OTHER PUBLICATIONS

Kim, et al., "New method to improve the adhesion strength of tungsten thin film on silicon by W2N glue layer", *Appl. Phys. Lett.*, 61 (5), 537–539, (Aug. 3, 1992).

Lahav, et al., "Measurement of thermal expansion coefficients of W, Wsi, WN and WSin thin film metallizations", *J. Appl. Phys.*, 67 (2), 734–738, (Jan., 1990).

Nakajima, et al., "Preparation of Tungsten Nitride Film by CVD Method Using WF6", *J. Electroshem. Soc.: Solid State Science and Technology*, vol. 134, No. 12, 3175–3178, (Dec. 1987).

\* cited by examiner

*Primary Examiner*—Olik Chaudhuri
*Assistant Examiner*—Ginette Peralta
(74) *Attorney, Agent, or Firm*—Schwegman, Lundberg, Woessner & Kluth, P.A.

(57) ABSTRACT

A method for depositing tungsten nitride uses a source gas mixture having a silicon based gas for depositing the tungsten nitride to overlie a deposition substrate. A non-planar storage capacitor has a tungsten nitride capacitor electrode.

35 Claims, 2 Drawing Sheets

METHOD OF DEPOSITING TUNGSTEN NITRIDE USING A SOURCE GAS COMPRISING SILICON

This application is a Divisional of U.S. Ser. No. 08/977,800, filed Nov. 25, 1997, which is a Continuation of U.S. Ser. No. 08/667,907, filed Jun. 12, 1996, now U.S. Pat. No. 5,691,235, issued Nov. 25, 1997, which is a Continuation of U.S. Ser. No. 08/348,646, filed Nov. 30, 1994, now abandoned.

FIELD OF THE INVENTION

The invention relates to processes for fabricating dynamic random access memories, and more particularly to the deposition of tungsten nitride.

BACKGROUND OF THE INVENTION

Tungsten nitride has been shown to be an extremely promising material for planar capacitor and gate electrode applications. Tungsten nitride is stable at high temperatures and prevents dielectric degradation in capacitor applications and acts as a barrier between polycrystalline silicon and tungsten when used as a low resistivity strapping layer in a gate electrode. In one fabrication method Alex Lahav, Karen A. Grim, and Ilan A. Blech, as described in their article, "Measurement of Thermal Expansion Coefficients of W, WSi, WN, and WSiN Thin Film Metallizations," Journal of Applied Physics 67(2), Jan. 15, 1990, page 734, prepare tungsten nitride using reactive sputtering and obtain good film properties.

Although sputtering can provide high quality films, surface step coverage is inadequate for many applications. It would be preferred to have an improved step coverage process such as chemical vapor deposition(CVD).

Nakajima et al. in an article entitled "Preparation of Tungsten Nitride Film by CVD Method Using $WF_6$," appearing in the December 1987 edition of the Journal of Electrochemical Society: SOLID-STATE SCIENCE AND TECHNOLOGY, has demonstrated chemical vapor deposition of tungsten nitride from $NH_3$ and $WF_6$ source gases in a conventional hot wall CVD system. Although hot wall CVD systems offer an advantage with respect to wafer throughput, process control and cleanliness are typically not adequate for state-of-the-art applications. Rather, single wafer cold wall deposition systems are preferred.

For a CVD process $WF_6$ and $NH_3$ offer the advantages of being readily available and providing high deposition rates. However, $WF_6$ and $NH_3$ form an adduct at low temperatures (<50° C.), and even with a cold wall system there is a minimum acceptable wall temperature to prevent adduct formation. Furthermore, byproducts of the deposition reactions can cause encroachment into silicon or polycrystalline silicon substrates and therefore the process must be modified to reduce encroachment without compromising adhesion or resistivity.

Thus, there exists a need for a CVD tungsten nitride process having good adhesion and high deposition rates while providing conformal, low resistivity films with minimal silicon encroachment.

SUMMARY OF THE INVENTION

The invention is a method for depositing tungsten nitride using chemical vapor deposition. The method uses a source gas mixture having a silicon based gas for depositing the tungsten nitride to overlie a deposition substrate.

The method is useful in the fabrication of a capacitor electrode, a contact plug, and a gate electrode due to the good adhesion, minimal silicon encroachment and low resistivity of the tungsten nitride deposited according to the method of the invention.

The invention is a non-planar storage capacitor having a tungsten nitride capacitor electrode.

BRIEF DESCRIPTION OF THE DRAWINGS

FIG. 1 is a cross-sectional view of a portion of a semiconductor substrate having various structures fabricated thereon and having a first capacitor electrode.

FIG. 2 is the cross-sectional view of FIG. 1 following the creation of a dielectric layer.

FIG. 3 is the cross-sectional view of FIG. 2 following the creation of a tungsten nitride electrode.

DETAILED DESCRIPTION

The invention is a tungsten nitride layer formed by a process of the invention in which the tungsten nitride is chemically vapor deposited from a source gas comprising a silicon based gas, such as silane. In one embodiment the invention is a semiconductor non-planar storage capacitor having a tungsten nitride capacitor electrode and is the method for forming the non-planar capacitor. Although the invention is applicable to any number of non-planar capacitors, including trench capacitors and a variety of stacked capacitors, FIGS. 1–3 depict the process steps for fabricating a stacked capacitor of the invention.

Figure 1:
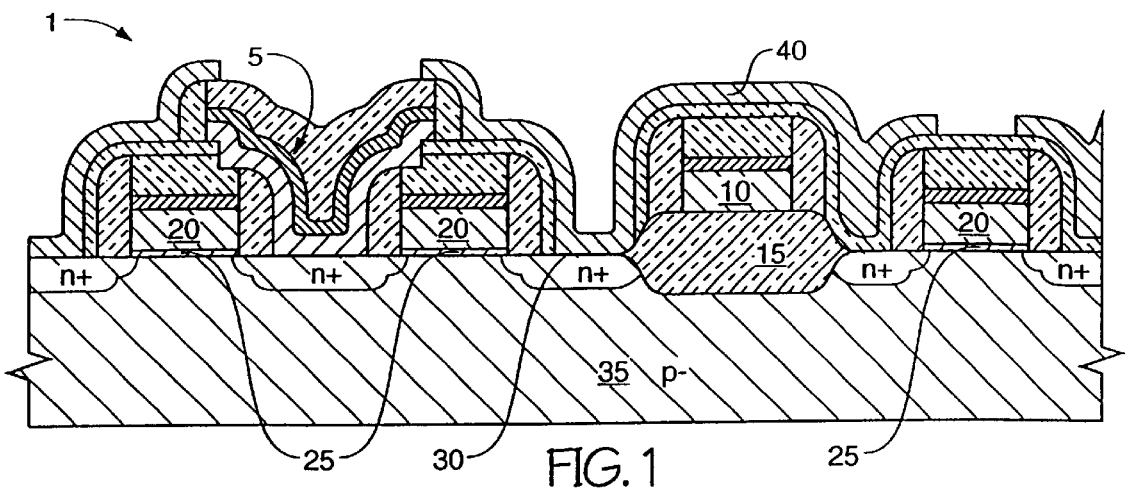
FIGS. 1–3 are cross sectional views of a semiconductor during various fabrication steps.

FIG. 1 is a cross-sectional view of a partially processed semiconductor device 1 having a buried bit line 5, a wordline 10 overlying a field oxide layer 15, and field effect transistors 20. A thin oxide layer 25 has been removed from a contact area 30 of the substrate 35 and a polycrystalline silicon (herein after also "polysilicon" or "poly") layer 40 has been deposited to overly the substrate 35 and contact the contact area 30 of the substrate 35. The poly layer 40 has been doped and patterned with a photo mask (not shown) to create a storage node plate or first electrode of the capacitor of the invention.

Figure 2:
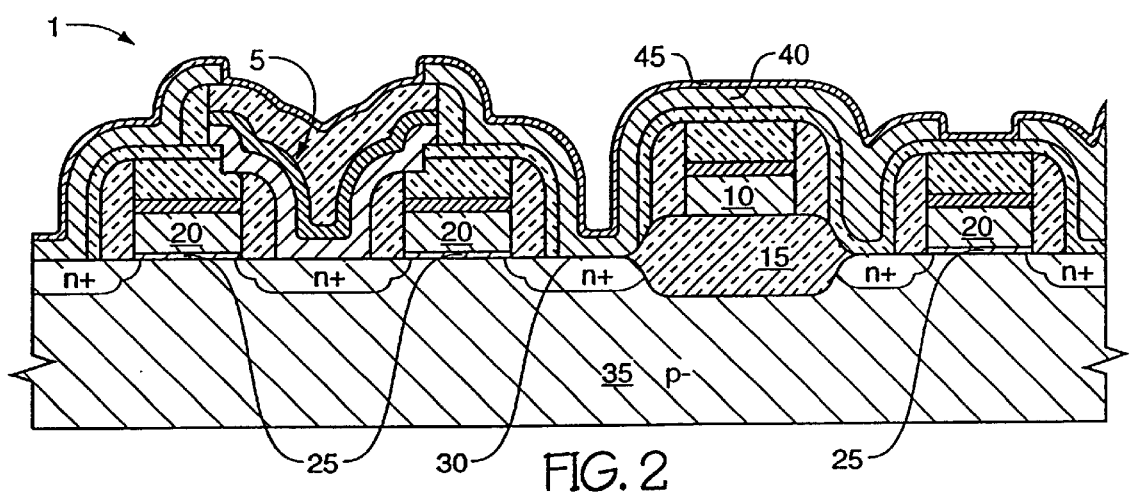

In FIG. 2 a dielectric layer 45, preferably tantalum oxide, is deposited to overly the polycrystalline silicon layer 40.

Figure 3:
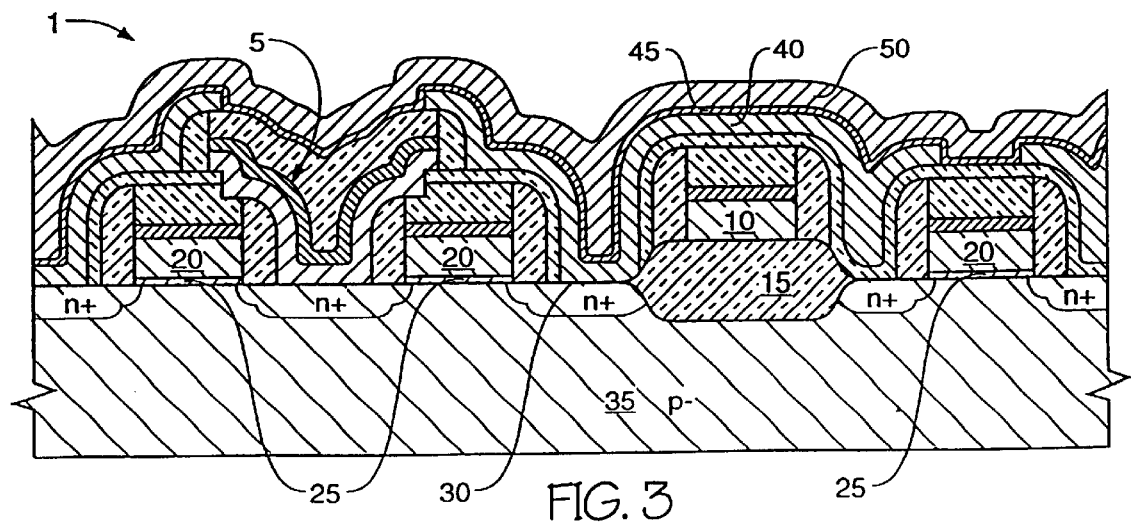

In FIG. 3 a tungsten nitride layer 50 is conformally deposited by chemical vapor deposition in a deposition chamber to overlie the dielectric layer 45 thereby forming a second electrode of the storage capacitor. During the chemical vapor deposition a source gas having at least a tungsten source such as tungsten hexaflouride combined with ammonia is combined with carrier gases which may include argon, hydrogen, nitrogen, or other gases. Alternate tungsten sources such as tungsten carbonyl may also be used. In a preferred embodiment the source gas also comprises a silicon based gas such as silane, organic silane, or a compound which is a multiple order of silane, such as di-silane and tri-silane. The source gas is maintained at a pressure conducive to chemical vapor deposition, typically within the range of pressures between 0.1 and 100 Torr including the end points. The temperature of the deposition substrate is maintained at 300° C., although other temperatures may be used. The temperature of the deposition chamber walls are held at a temperature which minimizes adduct formation, in this embodiment the walls are held at a temperature greater then 25° C. although other temperatures lower than the temperature of the deposition substrate will minimize adduct formation. In one embodiment the source gas comprises tungsten hexaflouride, ammonia, argon, and hydrogen. In this case during deposition of the tungsten nitride layer 20 the tungsten hexaflouride, ammonia, argon, and hydrogen have flow rates of 50 sccm, 150 sccm, 80 sccm and 80 sccm respectively. When silane is added to the source gas mixture the flow rate of the silane is equal to 4 sccm which is 1.098% of the total flow rate of the source gas mixture with the added silane.

In the capacitor of the invention and in other applications the addition of silane to the source gas reduces encroachment into any silicon based materials exposed to the tungsten nitride, improves adhesion of the tungsten nitride to its underlying layer, and reduces the bulk resistivity of the tungsten nitride. For most applications the flow rate of the silane or other silicon based gases should fall within the range of 0.5% to 5% of the total flow rate of the source gas comprising the silicon based gas, although flow rates from 0.1% to 25% of the total flow rate may be used.

It is possible to form the first electrode of the capacitor of the invention using the tungsten nitride when deposited according to the method described above. It is also conceivable that only the first electrode is tungsten nitride. In this case the second electrode overlying the dielectric may be some other material such as polysilicon.

Figure 4A:
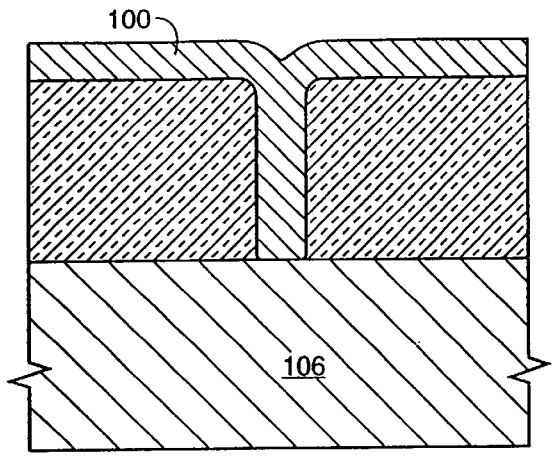
FIG. 4A is a cross-sectional view of a via formed in a substrate and filled with a layer of tungsten nitride.
Figure 4B:
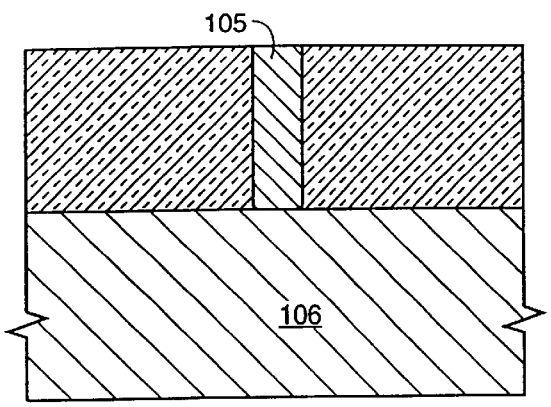
FIG. 4B is the cross-sectional view of FIG. 4A following a chemical mechanical planarization of the tungsten nitride layer of FIG. 4A.

In one embodiment the chemical vapor deposition of tungsten nitride using a source gas comprising silane is used to fill a via with tungsten nitride 100, see FIG. 4A. FIG. 4B shows the tungsten nitride contact plug 105 after chemical mechanical polishing of the tungsten nitride layer 100 shown in FIG. 4A. The contact plug 105 contacts the conductive layer 106.

Alternately the tungsten nitride may -be deposited using a source gas comprising silane wherein the deposited tungsten nitride does not fill the via but rather lines the via forming a barrier material. In this case tungsten is deposited to fill the portions of the via not filled by the tungsten nitride.

Figure 5:
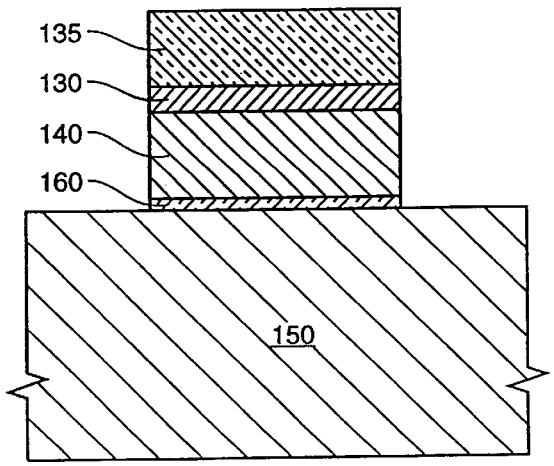
FIG. 5 is a cross-sectional view of a gate electrode having a tungsten nitride barrier layer.

In a further embodiment shown in FIG. 5 the chemical vapor deposition of tungsten nitride from a deposition gas comprising silane is used in field effect transistor applications to create a tungsten nitride barrier layer 130 interposed between a tungsten layer 135 and polycrystalline silicon layer 140. In this case exposed portions of the tungsten nitride 130, the tungsten layer 135 and the polycrystalline silicon layer 140 are removed in unpatterned areas to form a gate electrode 45 overlying substrate 150 and gate oxide 160 from masked portions of the tungsten nitride 130, the tungsten layer 135, and the polycrystalline silicon layer 140. In an alternate embodiment no polycrystalline silicon layer 140 is formed and the gate electrode comprises the tungsten nitride 130 and the tungsten layer 135.

Although specific embodiments have been described the invention should be read as limited only by the claims.

What is claimed is:

1. A method of forming a contact plug in an integrated circuit, the method comprising:
    fabricating a via in an insulating layer of the integrated circuit to expose a conductive layer;
    providing a source gas for use in a chemical vapor deposition process, wherein the source gas comprises a source of tungsten, a carrier gas, and silicon based gas;
    depositing a layer of tungsten nitride by performing a chemical vapor deposition process; and
    performing a chemical mechanical polish operation on the tungsten nitride layer.

2. A method of forming a tungsten nitride layer overlying a substrate, comprising:
    providing the substrate in a chamber;
    introducing a gas comprising nitrogen into the chamber;
    introducing a gas comprising tungsten into the chamber;
    introducing a gas comprising silicon into the chamber; and
    depositing a tungsten nitride layer to overly the substrate under chamber conditions sufficient to deposit tungsten nitride comprising silicon.

3. The method of claim 2, wherein the gas comprising nitrogen is ammonia, the gas comprising tungsten is tungsten hexaflouride and the gas comprising silicon is silane.

4. The method of claim 2, wherein the gas comprising nitrogen, the gas comprising tungsten and the gas comprising silicon form a source gas mixture.

5. The method of claim 2, wherein the gas comprising nitrogen, the gas comprising tungsten and the gas comprising silicon are separate sources having predetermined flow rates into the chamber.

6. The method of claim 2, wherein the gas comprising nitrogen is ammonia.

7. The method of claim 2, wherein the gas comprising tungsten is selected from the group consisting of: tungsten hexaflouride and tungsten carbonyl.

8. The method of claim 2, wherein the gas comprising silicon is selected from the group consisting of: silane, organic silane, and a compound that is a multiple order of silane.

9. The method of claim 2, wherein the chamber conditions include a temperature of an interior wall being maintained at least at a temperature of 25 degrees Celsius.

10. The method of claim 2, wherein the chamber conditions include a gas pressure between 0.1 and 100 Torr conducive to chemical vapor deposition.

11. A method of forming a tungsten nitride layer overlying a substrate, comprising:
    providing the substrate in a chamber;
    introducing a source gas mixture into the chamber, wherein the source gas mixture includes:
        ammonia;
        a gas selected from the group consisting of: tungsten hexaflouride and tungsten carbonyl; and
        a gas selected from the group consisting of: silane, organic silane, and a compound that is a multiple order of silane; and
    depositing a tungsten nitride layer to overly the substrate under chamber conditions sufficient to deposit tungsten nitride comprising silicon.

12. A method of forming a tungsten nitride layer overlying a substrate, comprising:
    providing the substrate in a chamber;
    providing conditions in the chamber sufficient to deposit tungsten nitride, including introducing nitrogen, tungsten and silicon into the chamber; and
    depositing a layer of tungsten nitride to overly the substrate.

13. The method of claim 12, wherein introducing nitrogen and tungsten into the chamber comprises introducing ammonia and tungsten hexaflouride.

14. The method of claim 12, wherein introducing nitrogen and tungsten into the chamber comprises introducing a source gas mixture into the chamber, the source gas mixture including a nitrogen-containing gas and a tungsten-containing gas.

15. A method of forming a tungsten nitride layer overlying a substrate, comprising:
    providing the substrate in a chamber;
    providing conditions in the chamber sufficient to deposit tungsten nitride, including introducing a source gas mixture into the chamber, the source gas mixture including a nitrogen-containing gas, a tungsten-containing gas, and a silicon-containing gas; and depositing a layer of tungsten nitride to overly the substrate.

16. A method of forming a tungsten nitride layer overlying a substrate, comprising:

providing the substrate in a chamber;

providing conditions in the chamber sufficient to deposit tungsten nitride, including introducing a source gas mixture into the chamber that includes nitrogen, tungsten and silicon; and depositing a layer of tungsten nitride to overly the substrate.

17. A method of forming a tungsten nitride layer overlying a substrate, comprising:

providing the substrate in a chamber;

providing conditions in the chamber sufficient to deposit tungsten nitride, including introducing ammonia, tungsten hexaflouride and silane into the chamber; and depositing a layer of tungsten nitride to overly the substrate.

18. The method of claim 17, wherein providing conditions in the chamber sufficient to deposit tungsten nitride comprises maintaining a temperature of an interior wall of the chamber at a temperature greater than 25 degrees Celsius.

19. A method of forming a tungsten nitride layer overlying a substrate, comprising:

providing the substrate in a chamber;

providing conditions in the chamber sufficient to deposit tungsten nitride, wherein providing conditions in the chamber includes introducing nitrogen, tungsten and silicon into the chamber; and depositing a layer of tungsten nitride comprising silicon to overly the substrate.

20. The method of claim 19, wherein introducing nitrogen includes introducing ammonia.

21. The method of claim 19, wherein introducing tungsten includes introducing a tungsten source selected from the group consisting of: tungsten hexaflouride and tungsten carbonyl.

22. The method of claim 19, wherein introducing silicon includes introducing a silicon-based gas selected from the group of silane, organic silane, and a compound that is a multiple order of silane.

23. The method of claim 19, wherein the chamber conditions include a temperature of an interior wall being maintained at least at a temperature of 25 degrees Celsius.

24. The method of claim 19, wherein the chamber conditions include a gas pressure between 0.1 and 100 Torr conducive to chemical vapor deposition.

25. A method of fabricating a non-planar capacitor electrode, comprising:

forming a layer of dielectric material;

providing nitrogen and tungsten for use in a chemical vapor deposition process; and depositing a layer of only tungsten nitride to form an electrode of the non-planar electrode.

26. The method of claim 25, wherein providing nitrogen, tungsten and silicon for use in a chemical vapor deposition process comprises providing ammonia and a gas selected from the group consisting of tungsten hexaflouride and tungsten carbonyl.

27. The method of claim 25, wherein providing nitrogen, tungsten and silicon for use in a chemical vapor deposition process comprises providing a source gas mixture that includes:

ammonia;

a gas selected from the group consisting of tungsten hexaflouride and tungsten carbonyl; and a gas selected from the group consisting of silane, organic silane, and a compound that is a multiple order of silane.

28. The method of claim 25, wherein the non-planar capacitor further includes a polysilicon second electrode separated from the tungsten nitride electrode by the layer of dielectric.

29. The method of claim 25, wherein the electrode formed from tungsten nitride is deposited on the dielectric layer.

30. The method of claim 25, wherein the dielectric layer includes tantalum oxide.

31. The method of claim 25, wherein the capacitor is selected from a group consisting of: a stacked capacitor and a trench capacitor.

32. A method of fabricating a contact plug in an integrated circuit, comprising:

fabricating a via in the integrated circuit to expose a conductive layer;

providing nitrogen, tungsten and silicon for use in a chemical vapor deposition process;

depositing a layer of tungsten nitride by performing a chemical vapor deposition process, wherein the layer of tungsten nitride includes silicon; and performing a chemical mechanical polish operation on the tungsten nitride layer.

33. The method of claim 32, wherein providing nitrogen, tungsten and silicon for use in a chemical vapor deposition process comprises providing a source gas mixture that includes:

ammonia;

a gas selected from the group consisting of tungsten hexaflouride and tungsten carbonyl; and a gas selected from the group consisting of silane, organic silane, and a compound that is a multiple order of silane.

34. A method of fabricating a gate electrode, comprising:

providing the substrate in a chamber;

providing conditions in the chamber sufficient to deposit tungsten nitride, including introducing nitrogen, tungsten and silicon into the chamber;

depositing a layer of tungsten nitride to overly the substrate, wherein the layer of tungsten nitride includes silicon;

patterning the layer of tungsten nitride to define the gate electrode; and removing a portion of the layer of tungsten nitride, wherein a remaining portion of the layer of tungsten nitride forms at least a portion of the gate electrode.

35. The method of claim 34, wherein providing conditions in the chamber sufficient to deposit tungsten nitride comprises providing a source gas mixture that includes:

ammonia;

a gas selected from the group consisting of tungsten hexaflouride and tungsten carbonyl; and a gas selected from the group consisting of silane, organic silane, and a compound that is a multiple order of silane.

* * * * *

UNITED STATES PATENT AND TRADEMARK OFFICE
CERTIFICATE OF CORRECTION

PATENT NO.    : 6,472,323 B1                                Page 1 of 1
DATED         : October 29, 2002
INVENTOR(S)   : Scott G. Meikle and Trung T. Doan It is certified that error appears in the above-identified patent and that said Letters Patent is hereby corrected as shown below:

<u>Column 3,</u>
Line 34, delete "-be" and insert -- be --, therefor.

<u>Column 5,</u>
Line 54, delete "and tungsten" and insert -- , tungsten and silicon --, therefor.
Line 56, delete "depositing a layer of only tungsten nitride to form an electrode of the non-planar electrode" and insert -- depositing a layer of tungsten nitride to form a non-planar capacitor electrode, wherein the layer of tungsten nitride includes silicon --, therefor.

Signed and Sealed this

Eleventh Day of March, 2003

JAMES E. ROGAN
*Director of the United States Patent and Trademark Office*